(12) United States Patent
Seppä

(10) Patent No.: US 9,647,577 B2
(45) Date of Patent: May 9, 2017

(54) POWER COLLECTOR STRUCTURE AND METHOD

(75) Inventor: Heikki Seppä, VTT (FI)

(73) Assignee: MURATA ELECTRONICS OY, Vantaa (FI)

( * ) Notice: Subject to any disclaimer, the term of this patent is extended or adjusted under 35 U.S.C. 154(b) by 465 days.

(21) Appl. No.: 13/821,295

(22) PCT Filed: Sep. 7, 2011

(86) PCT No.: PCT/FI2011/050768
§ 371 (c)(1),
(2), (4) Date: May 20, 2013

(87) PCT Pub. No.: WO2012/032221
PCT Pub. Date: Mar. 15, 2012

(65) Prior Publication Data
US 2013/0229089 A1  Sep. 5, 2013

(30) Foreign Application Priority Data

Sep. 7, 2010  (FI) ..................................... 20105929

(51) Int. Cl.
| | |
|---|---|
| *H02N 2/08* | (2006.01) |
| *H02N 2/18* | (2006.01) |
| *H02N 2/00* | (2006.01) |
| *H01L 41/113* | (2006.01) |
| *A43B 7/04* | (2006.01) |
| *B60C 23/04* | (2006.01) |
| *A43B 3/00* | (2006.01) |

(52) U.S. Cl.
CPC .............. *H02N 2/18* (2013.01); *A43B 3/0015* (2013.01); *A43B 7/04* (2013.01); *B60C 23/041* (2013.01); *B60C 23/0411* (2013.01); *H01L 41/1136* (2013.01); *H02N 2/22* (2013.01); *Y10T 29/42* (2015.01)

(58) Field of Classification Search
CPC .......... H02N 2/18; A43B 3/0015; A43B 7/04; B60C 23/0411
USPC .................................................. 310/339, 338
See application file for complete search history.

(56) References Cited

U.S. PATENT DOCUMENTS 7,353,720 B2   4/2008  Sinnett
7,423,350 B2   9/2008  Hattori et al.
(Continued)

FOREIGN PATENT DOCUMENTS

CN          101584511 A      11/2009
DE   10 2007 010 780 A1     12/2007
(Continued)

OTHER PUBLICATIONS

European Search Report dated Aug. 1, 2014, for corresponding European Patent Application No. 11823119.0.
(Continued)

*Primary Examiner* — Shawki S Ismail
*Assistant Examiner* — Bryan Gordon
(74) *Attorney, Agent, or Firm* — Squire Patton Boggs (US) LLP

(57) ABSTRACT

A power collector structure connected to a base is repetitively deformed or bent. The power collector structure is bar-like, and is connected to the base in an essentially rigid manner. A power collector for converting mechanical energy to electric power is connected to the power collector structure.

27 Claims, 2 Drawing Sheets

(56) References Cited

U.S. PATENT DOCUMENTS

| | | |
|---|---|---|
| 7,631,554 B2 | 12/2009 | Behrends et al. |
| 2004/0007942 A1 | 1/2004 | Nishida et al. |
| 2004/0100100 A1* | 5/2004 | Wilson .................. B60C 23/041 290/1 R |
| 2006/0006728 A1* | 1/2006 | Sinnett ................ B60C 23/0493 301/5.1 |
| 2006/0028333 A1* | 2/2006 | Tyndall .................. H02N 2/181 340/447 |
| 2007/0159625 A1* | 7/2007 | DiFoggio ................. G01J 3/02 356/328 |
| 2008/0074002 A1 | 3/2008 | Priya et al. |
| 2008/0100182 A1 | 5/2008 | Chang et al. |
| 2008/0264537 A1* | 10/2008 | Behrends .............. B60C 23/041 152/152.1 |
| 2009/0288315 A1 | 11/2009 | Liao |
| 2009/0315646 A1 | 12/2009 | Watanabe |
| 2010/0170332 A1* | 7/2010 | Kammann ............ B60C 23/041 73/146.5 |
| 2011/0012479 A1* | 1/2011 | Nakamura .......... B60C 23/0411 310/339 |
| 2011/0193696 A1* | 8/2011 | Wagner ................. B60C 23/064 340/438 |
| 2012/0206017 A1* | 8/2012 | Karkkainen ........ B60C 23/0411 310/339 |

FOREIGN PATENT DOCUMENTS

| | | |
|---|---|---|
| DE | 102007010781 A1 | 12/2007 |
| EP | 1 614 552 A1 | 1/2006 |
| EP | 1 623 849 A2 | 2/2006 |
| EP | 1 796 251 A1 | 6/2007 |
| GB | 2459685 A | 11/2009 |
| JP | H11-98868 A | 4/1999 |
| JP | 2003-164169 A | 6/2003 |
| JP | 2003-233894 A | 8/2003 |
| JP | 2005-086859 A | 3/2005 |
| JP | 2005-130624 A | 5/2005 |
| JP | 2005-312269 A | 11/2005 |
| JP | 2007-527681 A | 9/2007 |
| JP | 2007-282355 A | 10/2007 |
| JP | 2009-273339 A | 11/2009 |
| JP | 2009-542177 A | 11/2009 |
| JP | 2010-11547 A | 1/2010 |
| JP | 2010-500859 A | 1/2010 |
| WO | 2004/054823 A1 | 7/2004 |
| WO | WO 2004/054823 A1 | 7/2004 |
| WO | 2006/072539 A2 | 7/2006 |
| WO | 2007/099159 A1 | 9/2007 |
| WO | 2008/079321 A2 | 7/2008 |
| WO | 2010/052009 A1 | 5/2010 |
| WO | 2010/128864 A1 | 11/2010 |
| WO | 2011/042611 A1 | 4/2011 |

OTHER PUBLICATIONS

International Search Report dated Dec. 19, 2011 corresponding to International Patent Application No. PCT/FI2011/050768.

International Preliminary Report on Patentability dated Jan. 10, 2013 corresponding to International Patent Application No. PCT/FI2011/050768.

Finnish Search Report application No. 20105929 dated Jan. 26, 2011.

International Search Report application No. PCT/FI2011/050768 mailed Dec. 19, 2011.

Austrian Search Report international application No. 201301510-2 dated Aug. 29, 2013.

Japanese Office Action Notice of Reasons for Refusal application No. 526523/2013 dated Mar. 6, 2015.

European Search Report application No. 11 823 119.0 dated Feb. 17, 2015.

Chinese Office Action application No. 201180043060.6 dated May 13, 2015.

* cited by examiner

1 MEMS power collector
2 electronics
3 MEMS element
4 rectification
5 gauging electronics
6 transmission electronics
7 pressure sensor
8 antenna
9 bias voltage

POWER COLLECTOR STRUCTURE AND METHOD

The invention relates to a power collector structure according to the pre-characterizing part of claim 1.

The invention also relates to a method for collecting power.

In many wireless devices, the acquisition of power has arisen to a central position. For vibrating items, piezoelectricity-based solutions have been developed, but their operational life-time is poor. MEMS has been considered a promising solution, but the MEMS-structures' performance at collecting power, as such, is poor, due to their small size.

Also known are solutions for collecting power based on the RFID-technique, but in these, the hardware configuration is expensive. In car tyres, solutions for collecting power based on induction are also known, but in the mechanically extremely testing environment, the durability of these solutions has been poor. In gauging the pressure of car tires, also batteries have been used in connection with an electric pressure sensor and its transmitter, but the problem with such a solution is the recurring need for battery replacement.

In this invention, a method is presented for collecting power, said method being particularly well suited for use with car tyres. The method is based on a pin, which is caused to vibrate, when a portion of the tyre intended to contact the surface under the tyre is being bent as it hits the ground. Typically, one end of the pin is fixed to the tyre by vulcanization to the inner surface of the peripheral shell of the tyre. At the tip of the pin, there is such a MEMS acceleration sensor or piezoelectric element, which is able to collect power under influence of the accelerations associated with the changes in the motion state of the tyre. When the part of the surface of the car tyre facing the running surface makes contact with the road surface, a sudden change in angle of several tens of degrees will occur in the surface of the tyre, which change is dependent on the tyre pressure. As a result of the change in angle, the pin bends and starts vibrating. A periodical acceleration is incurred in the MEMS or piezoelectric collector at the tip of the pin, until attenuation dampens the vibration.

More precisely stated, the power collector according to the invention is characterized in what is presented in the characterizing part of claim 1.

As for the method according to the invention, it is characterized in what is presented in the characterizing part of claim 12.

In the power collector structure according to an embodiment of the invention, it is connected to the base so rigidly, that the intrinsic resonance frequency of the power collector structure determines the total resonance frequency to at least 50%.

The power collector structure according to an embodiment of the invention comprises an electromechanical converter.

In the power collector structure according to an embodiment of the invention, said electromechanical converter is a MEMS converter.

In the power collector structure according to an embodiment of the invention, the base is the inner surface of the periphery of a car tyre.

In the power collector structure according to an embodiment of the invention, the base is a shoe or part of it.

The power collector in the power collector structure according to an embodiment of the invention comprises a MEMS element.

The electromechanical converter of the power collector according to an embodiment of the invention is provided with bias means for providing said converter with a bias voltage.

According to an embodiment of the invention, said bias means are implemented by means of a piezoelectric element.

According to an embodiment of the invention, said bias means are implemented by means of a suitable material couple.

According to an embodiment of the invention, the power collector comprises a piezoelectric element.

In the power collector structure according to an embodiment of the invention, gauging electronics are integrated in the power collector.

In the power collector structure according to an embodiment of the invention, sending electronics are integrated in the power collector.

In the method according to an embodiment of the invention, the power collector structure being connected to the base so rigidly, that the intrinsic resonance frequency of the power collector structure determines the total resonance frequency to at least 50%.

In the method according to an embodiment of the invention, an electromechanical converter is being used as a power collector structure. In the method according to one embodiment of the invention, said electromechanical converter is a MEMS converter.

In the method according to an embodiment of the invention, the inner surface of the periphery of a car tyre is being used as a base.

In the method according to an embodiment of the invention, a shoe or a part of it is being used as a base.

In the method according to an embodiment of the invention, a MEMS element provided with a bias voltage is being used in the power collector.

In the method according to an embodiment of the invention, the bias voltage is implemented by means of a piezoelectric element.

In the method according to an embodiment of the invention, the bias voltage is implemented by means of a suitable couple of materials.

In the method according to an embodiment of the invention, a piezoelectric element is being used as the power collector.

In the method according to an embodiment of the invention, gauging electronics are integrated in the power collector.

In the method according to an embodiment of the invention, sending electronics are integrated in the power collector.

A car tyre according to an embodiment of the invention comprises a power collector according to one embodiment of the invention.

A shoe according to an embodiment of the invention comprises a power collector according to an embodiment of the invention.

A roller structure according to an embodiment of the invention contains a power collector according to an embodiment of the invention.

In a method, according to an embodiment of the invention, for manufacturing a power collector structure, it is formed by attaching to the power collector structure a component to be used presented in a method according to an embodiment of the invention.

In a method, according to an embodiment of the invention, for manufacturing a power collector structure, it is formed to be attached as a component of such a structure, according to an embodiment of the invention, like a car tyre, a part of a car tyre, a rim, or a combination of those, a shoe, or a roller structure.

Remarkable advantages are being achieved by means of the invention.

The invention provides an inexpensive and maintenance-free pressure sensor for, for instance, a car tyre. Calculations show, that then power exceeding 1 mW can easily be obtained by means of arrangements, which power is up to 10 times more than the power needed by the electronics associated with a pressure sensor. One preferable application of the method is the monitoring of the tyre pressure in vehicles, but the method can be used for other applications as well. In this method, we concentrate on that, at first, energy is being stored by a spring, but, of course, it is conceivable that energy through acceleration initially is being bound to kinetic energy of a mass. This opens up several application targets for the method. In addition to tyres, the functional principle of the method works in shoes and roller mats, for example, so it can be utilized in connection with, for example, snowmobile rollers for monitoring the condition of the roller or the snow characteristics.

Below, the invention is being examined with the aid of the embodiment examples according to the figures, in which FIG. 1, in a block diagram, shows a power collector according to the invention.

Figure 1:
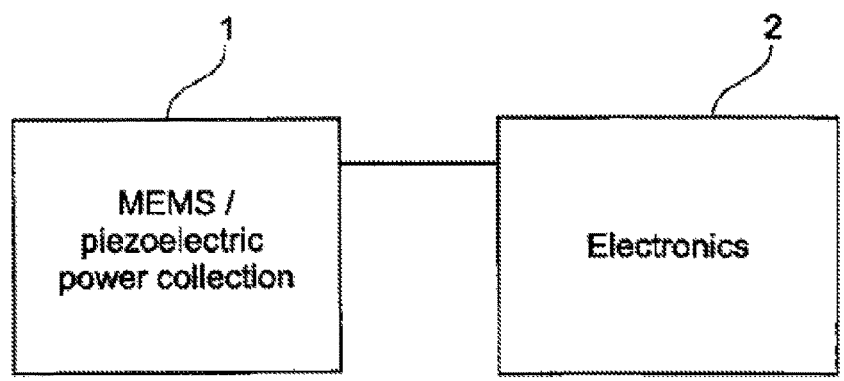

According to FIG. 1, an example of an embodiment of a power collector according to the invention comprises a power collector 1 connected to electronics 2 requiring electric power.

Figure 2:
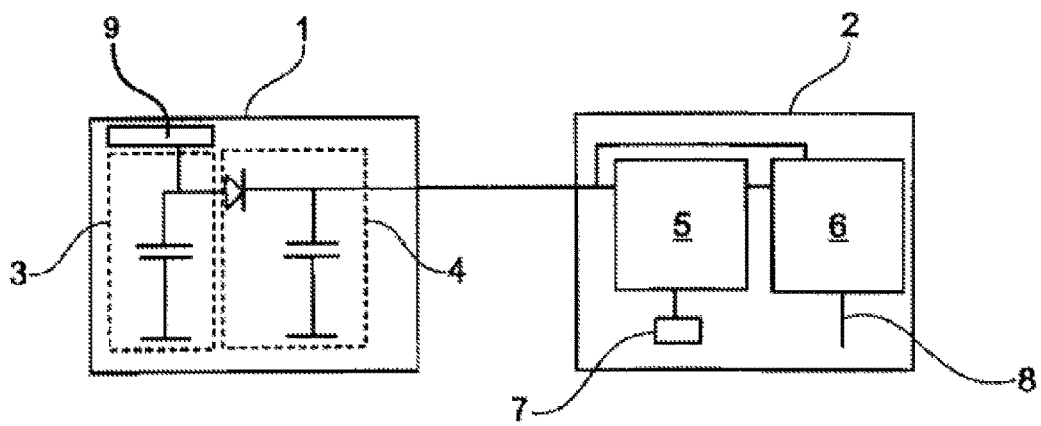
FIG. 2 shows the block diagram of FIG. 1 in more detail.

According to FIG. 2, the power collector typically comprises a MEMS element 3, the equivalent circuit of which, according to one embodiment of the invention, comprises a capacitor. In practice, the capacitance of this capacitor is created by a stationary electrode and a bar vibrator located adjacent to that, forming the other electrode of the capacitor. A bias voltage 9 is applied between these two electrodes, and then the vibrating bar of the bar vibrator generates an AC voltage between its poles. Bias voltage 9 can be formed by means of a battery, a piezoelectric element, or a so called build-in effect, whereby a voltage will appear between two different materials. This voltage is rectified by means of a rectifier 4 and is input to the electronic circuitry 2 comprising the gauging electronics 5, including the sensor 7 and the transmission electronics 6 to which a transmission antenna 8 is connected. The sensor 7 is typically a pressure sensor.

The element 3 can also be substituted by a piezoelectric element, which can be placed either at the tip of the pin 10, described below, or around said tip of it.

Figure 3:
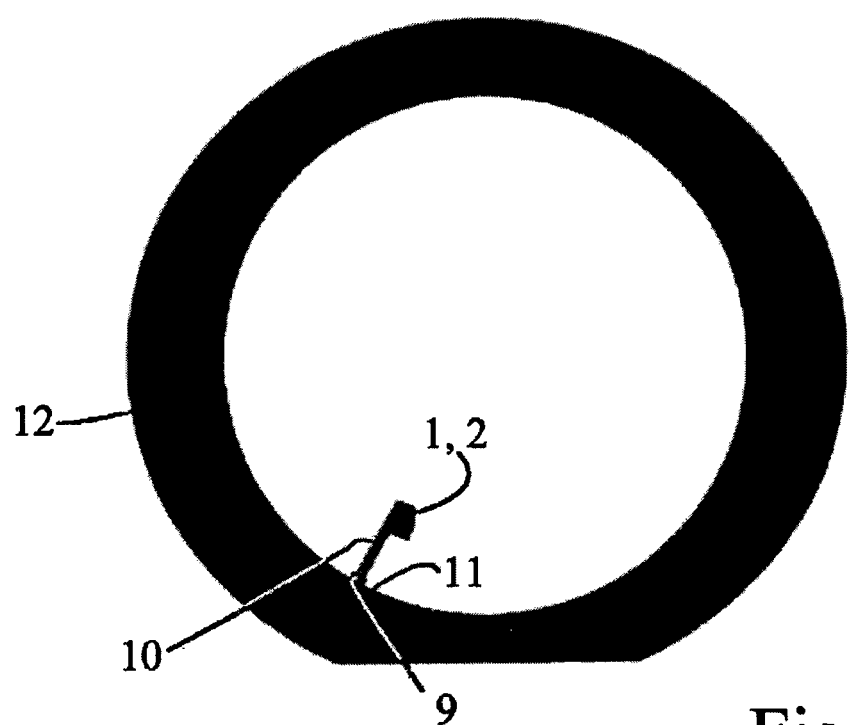
FIG. 3 shows an embodiment of the invention in connection with a car tyre.

According to FIG. 3, a rather short pin 10 is fixed to the tyre 12 at the inner surface 11 of the peripheral shell of the car tyre, i.e. into the pressurized interior of the car tyre 12. The pin 10 is fixed to the inner surface 11 of the peripheral shell by means of a suitable anchor 9. If the characteristic frequency of the pin 10 is sufficiently low, the mass of the pin 10 stays in place as the tyre bends, and then a spring transfers the change energy according to the spring constant of the pin into energy stored in the spring structure. After the change, the pin 10 starts vibrating at its characteristic frequency. A MEMS power collector 1, 2 is installed at the tip of the pin 10. According to one embodiment of the invention, it is also preferable for the pressure sensor 7 to be located at the tip of the pin in order to achieve a larger mass.

If the Q value of the pin 10 is sufficiently large, (frequently up to 1000), power is being collected in the form of electricity essentially solely via the MEMS 3. According to one embodiment of the invention, it is essential, that in the MEMS 3, there additionally is, for example, a piezoelectric element for generating the bias voltage, in order for the MEMS 3 to operate as a power collector. If, however, the gap in the MEMS is very narrow, the piezoelectric element can be eliminated, since the so called build-in voltage frequently generates a voltage across the gap. A battery can also be used for generating the bias voltage, without being restricted just to a battery alone. Then the battery will have very long lifetime, since the bias voltage alone, as such, will not deplete the battery at all, in practice.

In this application, the term "pin" denotes an elongated, bar-like structure with a minimum diameter clearly smaller than the length of the structure.

Mathematical Analysis

If the bending of the surface of the tyre 12 is sufficiently rapid, in a certain sense, in relation to the characteristic frequencies of the pin 10, the surface bends to the degree of an angle $\phi$, which essentially depends on the weight of the car and the tyre pressure. From the viewpoint of a mass at the tip of the pin, this means a displacement of $x_\Delta$. In this case, the energy stored by means of the pin 10 is $$E = \frac{1}{2}kx_\Delta^2 = \frac{1}{2}m\omega^2 x_\Delta^2$$

where k is the spring constant of the pin, $\omega$ is the characteristic frequency of the pin's vibration, and m is the mass of the pin. The displacement can be expressed by means of the length l of the pin and the angle $\phi$, which depicts the change in curvature as the pertinent part of the tyre has hit the road surface. The displacement can be given in the form $$x_\Delta = l \tan \phi$$

The angle $\phi$ can be expressed by means of the track 2h of the tyre on the underlying surface (the part having contact between the tyre, or corresponding, and the underlying surface) and the radius r of the tyre $$\phi = \arcsin h/r$$

i.e. yielding $$x_\Delta = l\tan\arcsin\frac{h}{r} = l\frac{h}{r\sqrt{1-(h/r)^2}} \approx l\frac{h}{r}$$

Now the total energy can be given in the form $$E = \frac{1}{2}m\omega^2 l^2 \left(\frac{h}{r}\right)^2$$

The assumption being that travel from a round part of the tyre to the flat one occurs as the tyre rotates through the displacement angle $\phi_m$. From this, the time associated with this displacement can be calculated.

$$\Delta t = \frac{r\phi_m}{v_a}$$

Since the mass at the change phase, because of mass inertia, must resist changes in the state of motion, remaining in its momentary state, for the change energy associated with the bending of the surface of the tyre to transfer into spring energy, we arrive at a prerequisite for the mechanical resonance frequency of the pin.

$$\omega \leq 2\pi \frac{v_a}{r\varphi_m}$$

If this delimiting frequency is used, the maximum energy is obtained in the form $$E = 4\pi^2 \frac{1}{2} m v_a^2 \left(\frac{lh}{r^2 \varphi_m}\right)^2$$

Energy is obtained twice per rotation, so the repetition frequency will be $$f = \frac{v_a}{\pi r}$$

Now the average power can be expressed in the form $$P = 4\pi \frac{v_a}{r} \left(\frac{lh}{\varphi_m r^2}\right)^2 \frac{1}{2} m v_a^2$$

Assuming the pin having the mass m=0.002 kg (0.07 ounce), the velocity being $v_a$=50 km/h (31 mile/h), the length of the pin l=0.01 m (0.39 inch), the radius of the tyre r=0.30 m (11.81 inch) and the total length of the track 2h=0.1 m (3.94 inch) and the bending angle, corresponding to the track, being $\varphi_m$=0.03 rad (1.72 degree), the power obtained is P=0.4 W. In practice there will be less power, since the resonance frequency of the pin cannot be dimensioned to be arbitrarily large. On the other hand, the MEMS element 3 is not necessarily able to collect, in its entirety, all of the energy bound to the pin. However, the quality factor of this kind of pin or bar 10 can be up to 1000, so the MEMS element 3 constitutes a load to the vibration in such a way, that the quality factor is determined by the power collection by the MEMS. Considering that the characteristic frequency is dimensioned at about 10 times lower than the maximum frequency, the power will be about 4 mW. Typically, a sensor for the pressure in a car tyre requires about 0.1 mW of power, so the technique according to the method according to an embodiment of the invention is sufficient for that application.

The primary application of the invention is collecting power from a tyre. In applications in which there is vibration or bending of a structure, the method can be utilized. In a car tyre, also the pressure can be gauged by means of the Q-value of the pin 10, which is proportional to the pressure in the tyre 12. Regrettably, dampness also influences the result. The pendulum motion of the pin 10 must perhaps be restricted in order for the structure according to an embodiment of the invention to be durable. An advantage of the method according to an embodiment of the invention is that the bending, as such, is not depending on the speed of the car, in the same way as the acceleration. If the acceleration does not directly influence the transversal motion of the pin, the invention enables such a structural solution in which such a durable structure is achieved, which is able to collect power also at low tyre speeds.

The durability of the structure according to an embodiment of the invention can be improved such, that the pin 10 lightly touches a delimiter, a rubber stop, for instance, and thus any large motion is subject to damping. The maximum amplitude can also be attenuated by this method. If the spring in the structure is stiff, the mass will follow the bending, whereby the pin is subject to less bending, which improves the durability of the pin.

The invention claimed is:

1. A power collector structure connected to a base that is repetitively deformed or bent in rotational motion,
    wherein
        the power collector structure is bar-like,
        the power collector structure is connected only at one end of the bar-like structure to the base,
        the one end of the power collector structure is connected to the base in an essentially rigid manner,
        the power collector structure extends radially from the base,
        a power collector for converting mechanical energy to electric power is connected to a tip of the power collector structure, wherein the tip is opposite to the one end of the power collector structure connected to the base, and
    wherein the tip of the bar-like structure is configured to vibrate when the base is deformed or bent to produce the mechanical energy.

2. The power collector structure according to claim 1, wherein the power collector structure is connected to the base so rigidly, that the intrinsic resonance frequency of the power collector structure determines the total resonance frequency to at least 50%.

3. The power collector structure according to claim 1, wherein the power collector structure comprises an electromechanical converter.

4. The power collector structure according to claim 1, wherein the base is the inner surface of the periphery of a car tire.

5. The power collector structure according to claim 1, wherein the base is a shoe or a part of it.

6. The power collector structure according to claim 1, wherein the power collector comprises bias means for providing a MEMS element with a bias voltage.

7. The power collector structure according to claim 6, wherein the bias means for providing the bias voltage is implemented by means of a piezoelectric element.

8. The power collector structure according to claim 6, wherein the bias means for providing the bias voltage is implemented by means of a suitable material couple.

9. The power collector structure according to claim 1, wherein the power collector comprises a piezoelectric element.

10. The power collector structure according to claim 1, wherein gauging electronics are integrated in the power collector.

11. The power collector structure according to claim 1, wherein transmission electronics are integrated in the power collector.

12. A method for collecting power of a base that is repetitively deformed or bent in rotational motion, in which method a power collector structure is being used, said method comprising:

connecting only one end of a bar-like power collector structure essentially rigidly to the base such that the power collector structure extends radially from the base; and converting mechanical energy to electric power by a power collector at another end of the power collector structure opposite to the one end, wherein the another end of the bar-like power collector structure is configured to vibrate when the base is deformed or bent to produce the mechanical energy.

13. The method according to claim 12, wherein the power collector structure is so rigidly connected to the base that an intrinsic resonance frequency of the power collector structure determines a total resonance frequency to at least 50%.

14. The method according to claim 12, wherein an electromechanical converter is being used as the power collector structure.

15. The method according to claim 12, wherein an inner surface of a periphery of a car tire is being used as the base.

16. The method according to claim 12, wherein, a shoe, or a part of it, is being used as the base.

17. The method according to claim 12, wherein a MEMS element provided with a bias voltage is being used as the power collector.

18. The method according to claim 17, wherein the bias voltage is implemented by a piezoelectric element.

19. The method according to claim 17, wherein the bias voltage is implemented by a suitable material couple.

20. The method according to claim 12, wherein a piezoelectric element is used as the power collector.

21. The method according to claim 12, wherein gauging electronics are integrated in the power collector.

22. The method according to claim 12, wherein transmission electronics are integrated in the power collector.

23. A car tire, comprising a power collector structure according to claim 1.

24. A shoe, comprising a power collector structure according to claim 1.

25. A roller structure, comprising a power collector structure according to claim 1.

26. A method for manufacturing a power collector structure, comprising:

forming the power collector structure by connecting to the power collector structure a part according to claim 1.

27. The method according to claim 26, wherein the power structure comprises at least one of a car tire, a part of a car tire, a rim, a shoe, or a roller structure.

* * * * *